(12) United States Patent
Ahmed et al.

(10) Patent No.: US 7,256,455 B2
(45) Date of Patent: Aug. 14, 2007

(54) DOUBLE GATE SEMICONDUCTOR DEVICE HAVING A METAL GATE

(75) Inventors: Shibly S. Ahmed, San Jose, CA (US); Haihong Wang, Fremont, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 253 days.

(21) Appl. No.: 10/720,166

(22) Filed: Nov. 25, 2003

(65) Prior Publication Data
US 2004/0110097 A1 Jun. 10, 2004

Related U.S. Application Data

(63) Continuation of application No. 10/310,777, filed on Dec. 6, 2002, now Pat. No. 6,686,231.

(51) Int. Cl.
  *H01L 27/12* (2006.01)
  *H01L 29/786* (2006.01)
  *H01L 29/76* (2006.01)

(52) U.S. Cl. ............ 257/347; 257/401; 257/410; 257/412; 257/E29.022; 257/E29.299; 257/E21.411; 257/E21.7

(58) Field of Classification Search ............ 438/151, 438/164, 517, 524, 585, 157; 257/347, 410, 257/412, E29.022, E29.026, E29.027, E29.028, 257/E29.273, E29.299, E21.411, E21.412, 257/E21.7, E21.704
See application file for complete search history.

(56) References Cited

U.S. PATENT DOCUMENTS

| 5,801,397 | A | 9/1998 | Cunningham | 257/66 |
|---|---|---|---|---|
| 5,960,270 | A | 9/1999 | Misra et al. | 438/197 |
| 6,265,256 | B1 | 7/2001 | An et al. | 438/201 |
| 6,303,447 | B1 | 10/2001 | Chhagan et al. | 438/299 |
| 6,342,410 | B1 | 1/2002 | Yu | 438/164 |
| 6,396,108 | B1 | 5/2002 | Krivokapic et al. | 257/365 |

(Continued)

FOREIGN PATENT DOCUMENTS

EP    1 383 164 A1    1/2004

(Continued)

OTHER PUBLICATIONS

Co-pending U.S. Appl. No. 10/645,577; entitled Sacrificial Oxide Protection During Dummy Gate Removal in Damascene Gate Process in Semiconductor Devices; filed on Aug. 22, 2003; 28 pages.

(Continued)

*Primary Examiner*—M. Wilczewski
(74) *Attorney, Agent, or Firm*—Harrity Snyder LLP

(57) ABSTRACT

A semiconductor device may include a substrate, an insulating layer formed on the substrate and a conductive fin formed on the insulating layer. The conductive fin may include a number of side surfaces and a top surface. The semiconductor device may also include a source region formed on the insulating layer adjacent a first end of the conductive fin and a drain region formed on the insulating layer adjacent a second end of the conductive fin. The semiconductor device may further include a metal gate formed on the insulating layer adjacent the conductive fin in a channel region of the semiconductor device.

16 Claims, 10 Drawing Sheets

U.S. PATENT DOCUMENTS

| | | | |
|---|---|---|---|
| 6,406,951 B1 | 6/2002 | Yu | 438/183 |
| 6,413,802 B1 | 7/2002 | Hu et al. | 438/151 |
| 6,458,662 B1 | 10/2002 | Yu | 438/286 |
| 6,465,823 B1 | 10/2002 | Yagishita et al. | 438/157 |
| 6,475,890 B1 | 11/2002 | Yu | 438/574 |
| 6,509,611 B1 | 1/2003 | Park et al. | 257/330 |
| 6,515,320 B1 | 2/2003 | Azuma et al. | 257/288 |
| 6,525,403 B2 | 2/2003 | Inaba et al. | 257/618 |
| 6,551,885 B1 | 4/2003 | Yu | 438/300 |
| 6,551,886 B1 | 4/2003 | Yu | 438/300 |
| 6,562,665 B1 | 5/2003 | Yu | 438/149 |
| 6,583,469 B1 | 6/2003 | Fried et al. | 257/329 |
| 6,645,797 B1 | 11/2003 | Buynoski et al. | 438/157 |
| 6,686,231 B1 | 2/2004 | Ahmed et al. | 438/164 |
| 6,764,884 B1 | 7/2004 | Yu et al. | 438/157 |
| 6,765,303 B1 | 7/2004 | Krivokapic et al. | 257/903 |
| 6,855,990 B2 * | 2/2005 | Yeo et al. | 257/353 |
| 2002/0153587 A1 | 10/2002 | Adkisson et al. | |
| 2002/0177263 A1 | 11/2002 | Hanafi et al. | 438/183 |
| 2003/0111686 A1 | 6/2003 | Nowak | |
| 2003/0113970 A1 | 6/2003 | Fried et al. | |
| 2003/0141525 A1 | 7/2003 | Nowak | |
| 2003/0151077 A1 | 8/2003 | Mathew et al. | |
| 2005/0104091 A1 | 5/2005 | Tabery et al. | 257/213 |

FOREIGN PATENT DOCUMENTS

| | | |
|---|---|---|
| WO | WO 03/015182 A2 | 2/2003 |

OTHER PUBLICATIONS

Co-pending U.S. Appl. No. 10/320,536; entitled "FinFET Gate Formation Using Reverse Trim of Dummy Gate"; filed on Dec. 17, 2002; 25 pages.

Co-pending U.S. Appl. No. 10/459,589; entitled "FinFET Gate Formation Using Reverse Trim and Oxide Polish"; filed on Jun. 12, 2003; 45 pages.

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang et al., "Sub 50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

U.S. Appl. No. 10/754,559; filed Jan. 12, 2004; entitled: "Damascene Tri-Gate FinFET"; 28 pages.

Stephen H. Tang et al., "Comparison of Short-Channel Effect and Offstate Leakage in Symmetric vs. Asymmetric Double Gate MOSFETs", IEEE International SOI Conference, Oct. 2000, pp. 120-121.

* cited by examiner

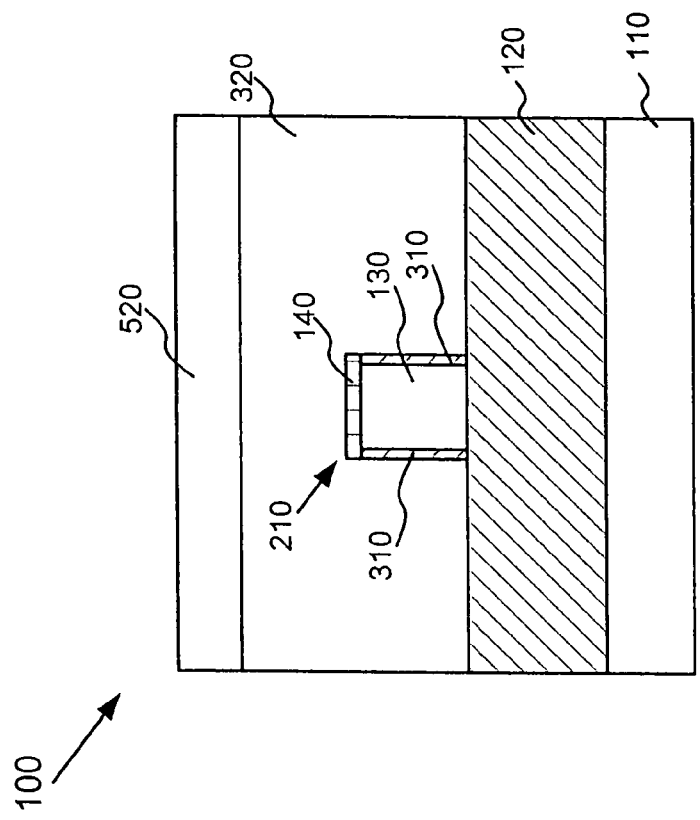
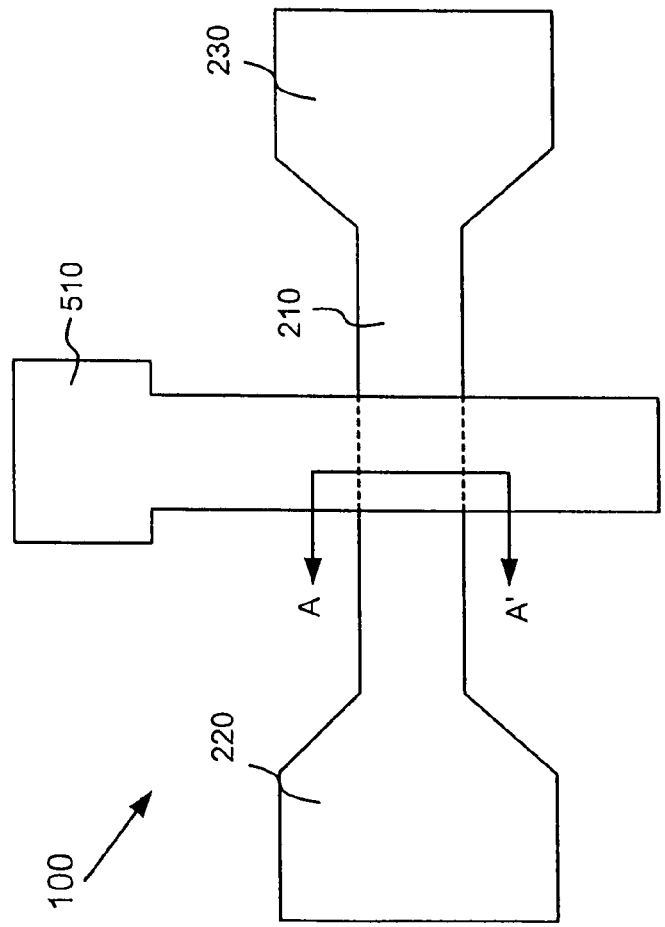

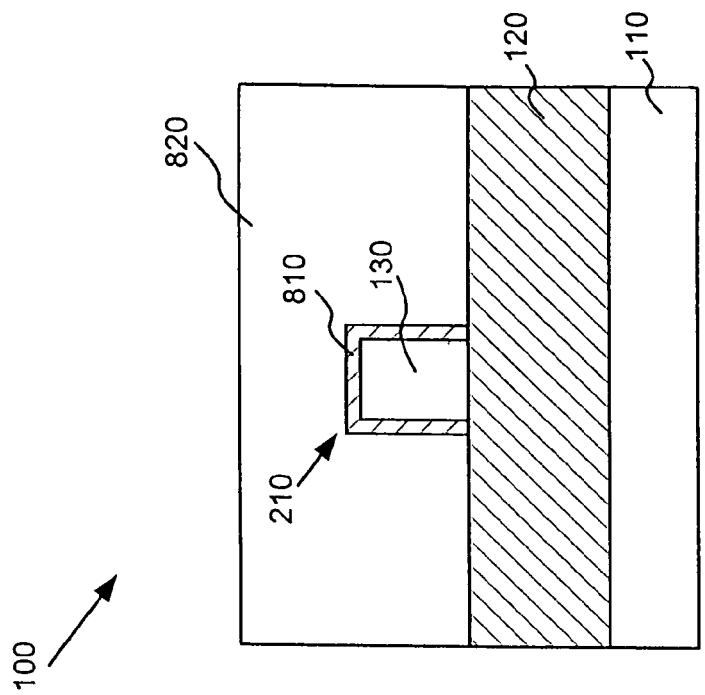
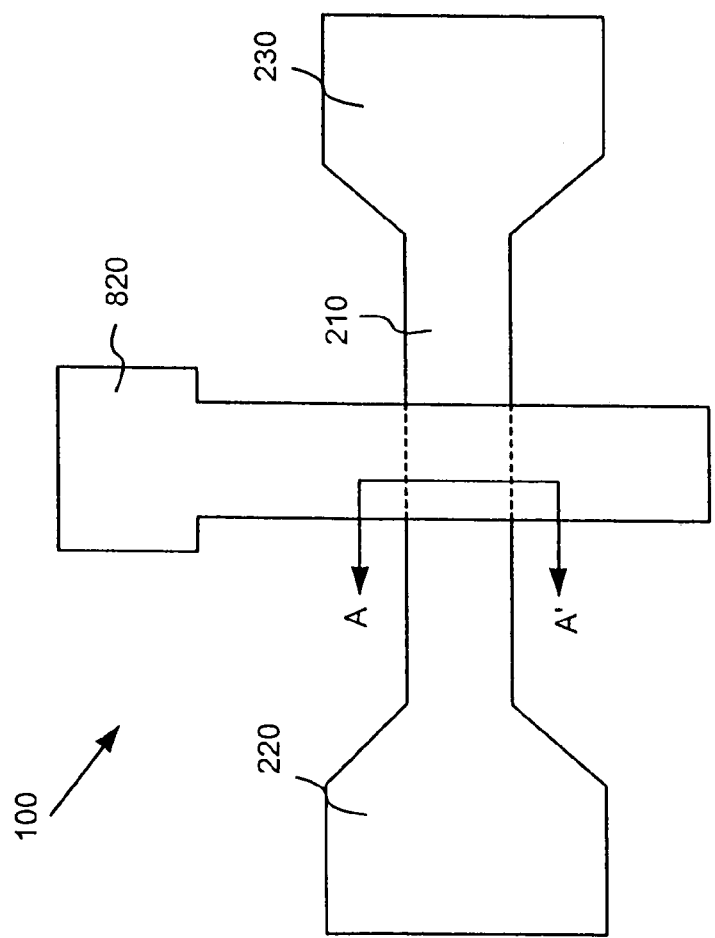

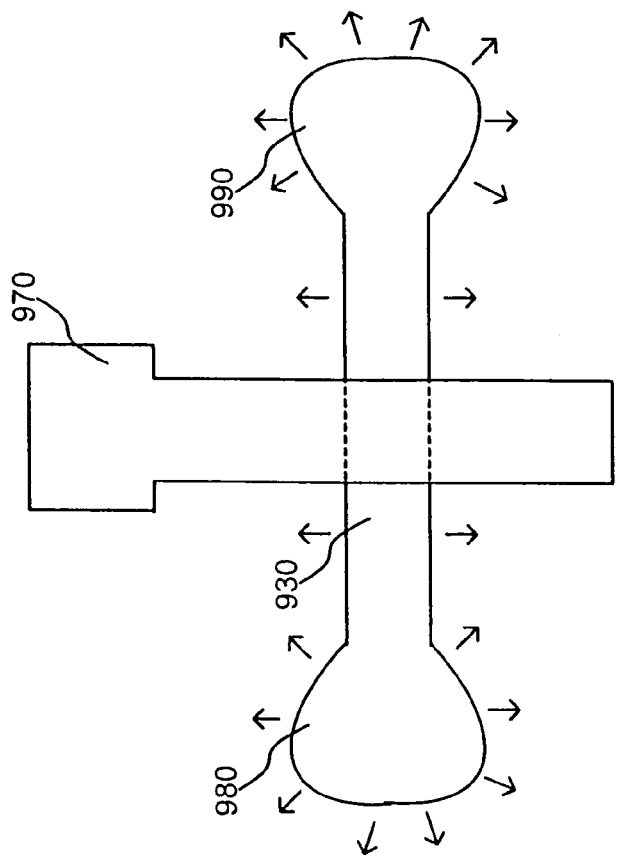
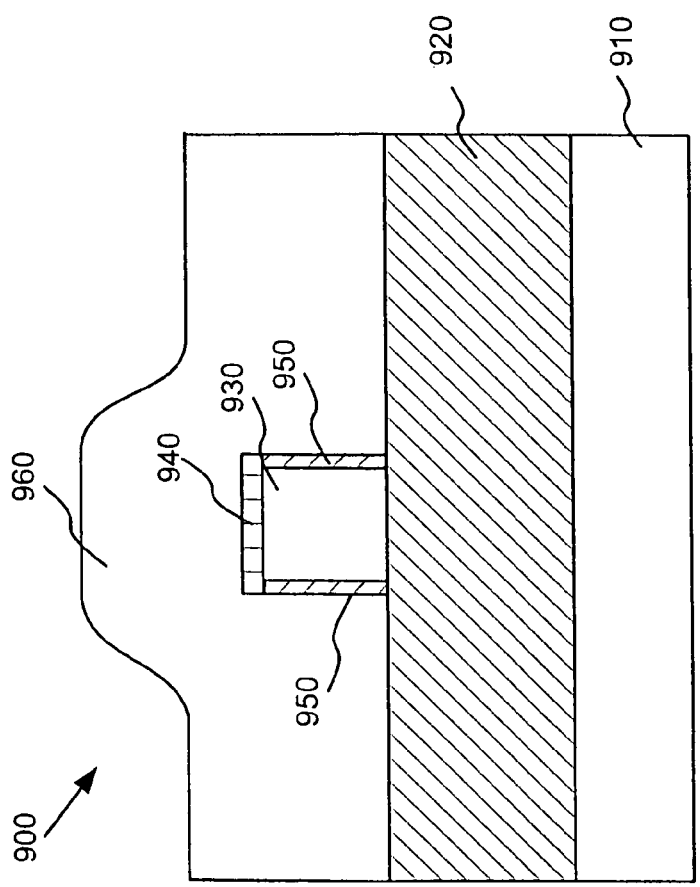
Fig. 9B
Fig. 9A

DOUBLE GATE SEMICONDUCTOR DEVICE HAVING A METAL GATE

RELATED APPLICATION

This application is a continuation of U.S. patent application Ser. No. 10/310,777, filed Dec. 6, 2002, now U.S. Pat. No. 6,686,231, which is incorporated herein by reference.

TECHNICAL FIELD

The present invention relates to semiconductor devices and methods of manufacturing semiconductor devices. The present invention has particular applicability to double-gate devices.

BACKGROUND ART

The escalating requirements for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In several respects, the double-gate MOSFETs offer better characteristics than the conventional bulk silicon MOSFETs. These improvements arise because the double-gate MOSFET has a gate electrode on both sides of the channel, rather than only on one side as in conventional MOSFETs. When there are two gates, the electric field generated by the drain is better screened from the source end of the channel. Also, two gates can control roughly twice as much current as a single gate, resulting in a stronger switching signal.

A FinFET is a recent double-gate stricture that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention may provide a method of forming a FinFET device that includes a high-k gate dielectric and a metal gate using a damascene process. A sacrificial oxide layer may be formed around a gate structure, which may be removed and replaced with a metal gate.

Additional advantages and other features of the invention will be set forth in part in the description which follows and in part will become apparent to those having ordinary skill in the art upon examination of the following or may be learned from practice of the invention. The advantages and features of the invention may be realized and obtained as particularly pointed out in the appended claims.

According to the present invention, the foregoing and other advantages are achieved in part by a method of manufacturing a semiconductor device including forming a fin and forming a gate structure over a portion of the fin. The method may also include forming a dielectric layer adjacent the gate structure, etching the gate structure to form a gate recess and depositing a metal in the gate recess.

According to another aspect of the invention, a method of manufacturing a semiconductor device may include forming a fin on an insulator and forming a gate structure extending over a channel portion of the fin. The method may also include forming a sacrificial layer adjacent the gate structure and removing the gate structure to define a gate recess. The method may also include forming a metal gate in the gate recess.

According to a further aspect of the invention, a semiconductor device may include a substrate, an insulating layer, a conductive fin, a source region, a drain region and a metal gate. The insulating layer may be formed on the substrate and the conductive fin formed on the insulating layer. The conductive fin may include a number of side surfaces and a top surface. The source region may be formed on the insulating layer adjacent a first end of the conductive fin and the drain region may be formed on the insulating layer adjacent a second end of the conductive fin. The metal gate may be formed on the insulating layer adjacent the conductive fin in a channel region of the semiconductor device.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, where elements having the same reference number designation may represent like elements throughout.

FIG. 5A schematically illustrates a top view of a FinFET structure in accordance with an exemplary embodiment of the present invention.

FIG. 5B is a cross-section illustrating the formation of the FinFET structure of FIG. 5A in accordance with an exemplary embodiment of the present invention.

FIG. 8A schematically illustrates the top view of the FinFET structure in accordance with an exemplary embodiment of the present invention.

FIG. 8B is a cross-section illustrating a final stage in the formation of the FinFET structure of FIG. 8A in accordance with an exemplary embodiment of the present invention.

FIGS. 9A and 9B are cross-sections illustrating reducing parasitic resistance in a FinFET in accordance with another implementation of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide a method of forming a FinFET device that improves a smallest feature size in the gate. To improve the smallest feature size, the gate material may be planarized before gate patterning. In addition, an antireflective coating may be formed on the planarized gate material.

Figure 1:
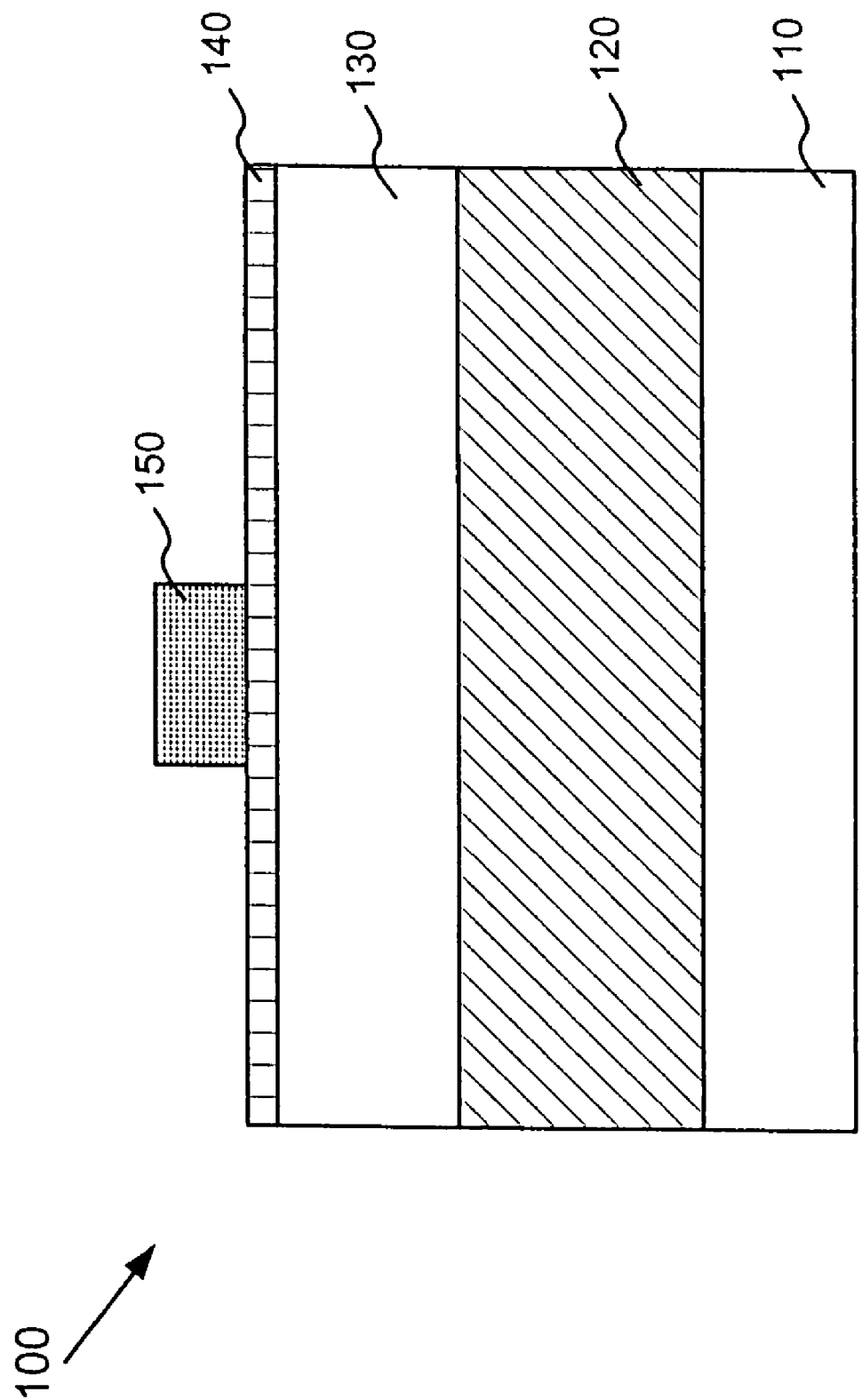
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 formed on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1000 Å to about 3000 Å. Silicon layer 130 may include monocrystalline or polycrystalline silicon having a thickness ranging from about 300 Å to about 1500 Å. Silicon layer 130 is used to form a fin structure for a double gate transistor device, as described in more detail below.

In alternative implementations consistent with the present invention, substrate 110 and layer 130 may include other semiconducting materials, such as germanium, or combinations of semiconducting materials, such as silicon-germanium. Buried oxide layer 120 may also include other dielectric materials.

A thick sacrificial oxide layer 140, such as a silicon nitride layer or a silicon oxide layer (e.g., $SiO_2$), may be formed over silicon layer 130 to act as a protective cap during subsequent etching processes. In an exemplary implementation, thick sacrificial oxide layer 140 may be grown to a thickness ranging from about 150 Å to about 700 Å. Next, a photoresist material may be deposited and patterned to form a photoresist mask 150 for subsequent processing. The photoresist may be deposited and patterned in any conventional manner.

Semiconductor device 100 may then be etched and the photoresist mask 150 may be removed. In an exemplary implementation, silicon layer 130 may be etched in a conventional manner, with the etching terminating on buried oxide layer 120 to form a fin. After the formation of the fin, source and drain regions may be formed adjacent the respective ends of the fin. For example, in an exemplary embodiment, a layer of silicon, germanium or combination of silicon and germanium may be deposited, patterned and etched in a conventional manner to form source and drain regions.

Figure 2A:
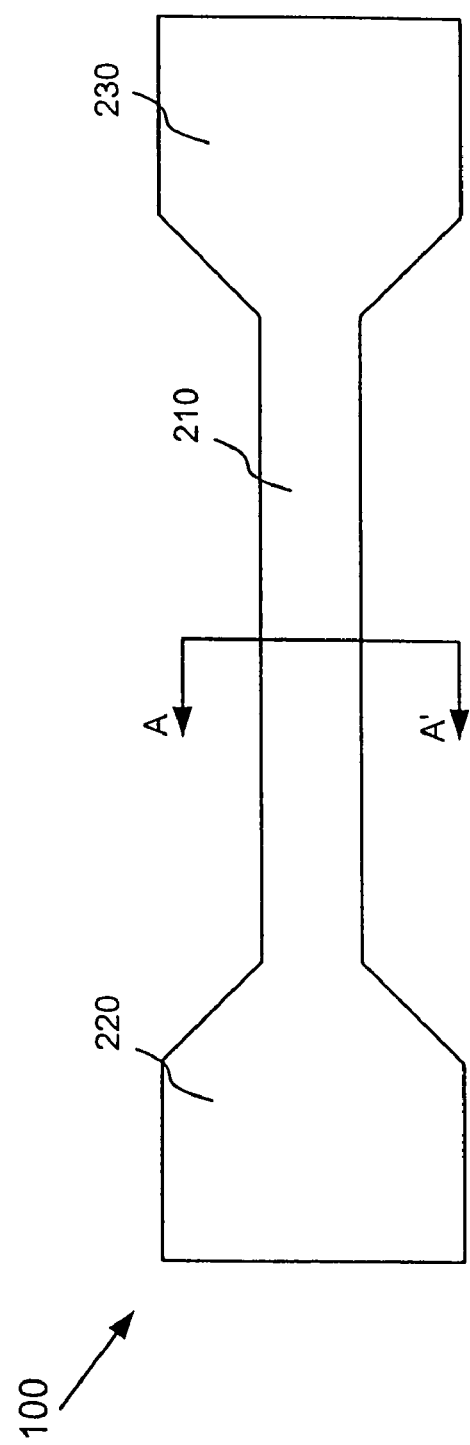
FIG. 2A schematically illustrates the top view of a fin structure in accordance with an exemplary embodiment of the present invention.

FIG. 2A schematically illustrates the top view of a fin structure on semiconductor 100 formed in such a manner. Source region 220 and drain region 230 may be formed adjacent to and at the ends of fin 210 on buried oxide layer 120, according to an exemplary embodiment of the present invention.

Figure 2B:
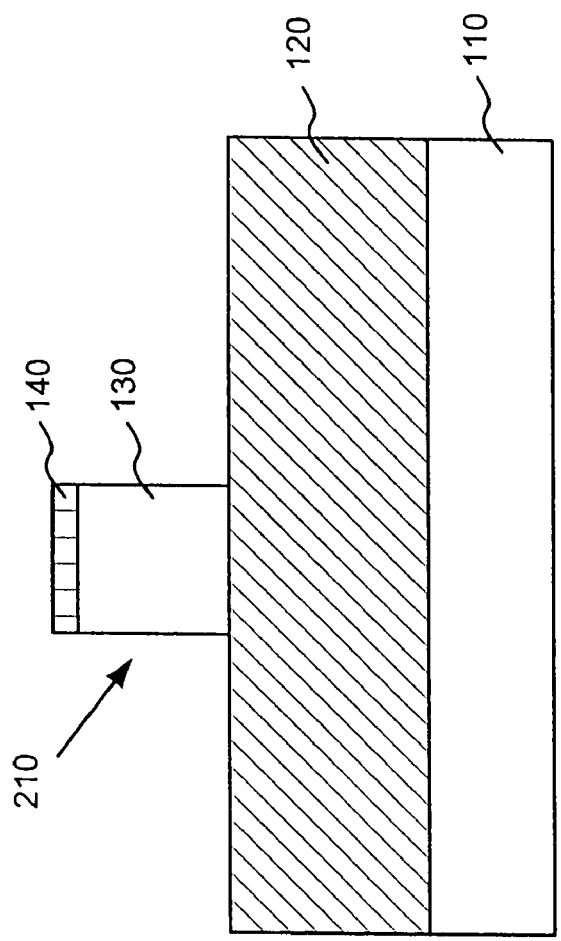
FIG. 2B is a cross-section illustrating the formation of the fin structure of FIG. 2A in accordance with an exemplary embodiment of the present invention.

FIG. 2B is a cross-section along line A-A' in FIG. 2A illustrating the formation of fin structure 210 in accordance with an exemplary embodiment of the present invention. As described above, thick sacrificial oxide layer 140 and silicon layer 130 may be etched to form fin 210. Fin 210 may include silicon 130 and a sacrificial oxide cap 140.

Figure 3:
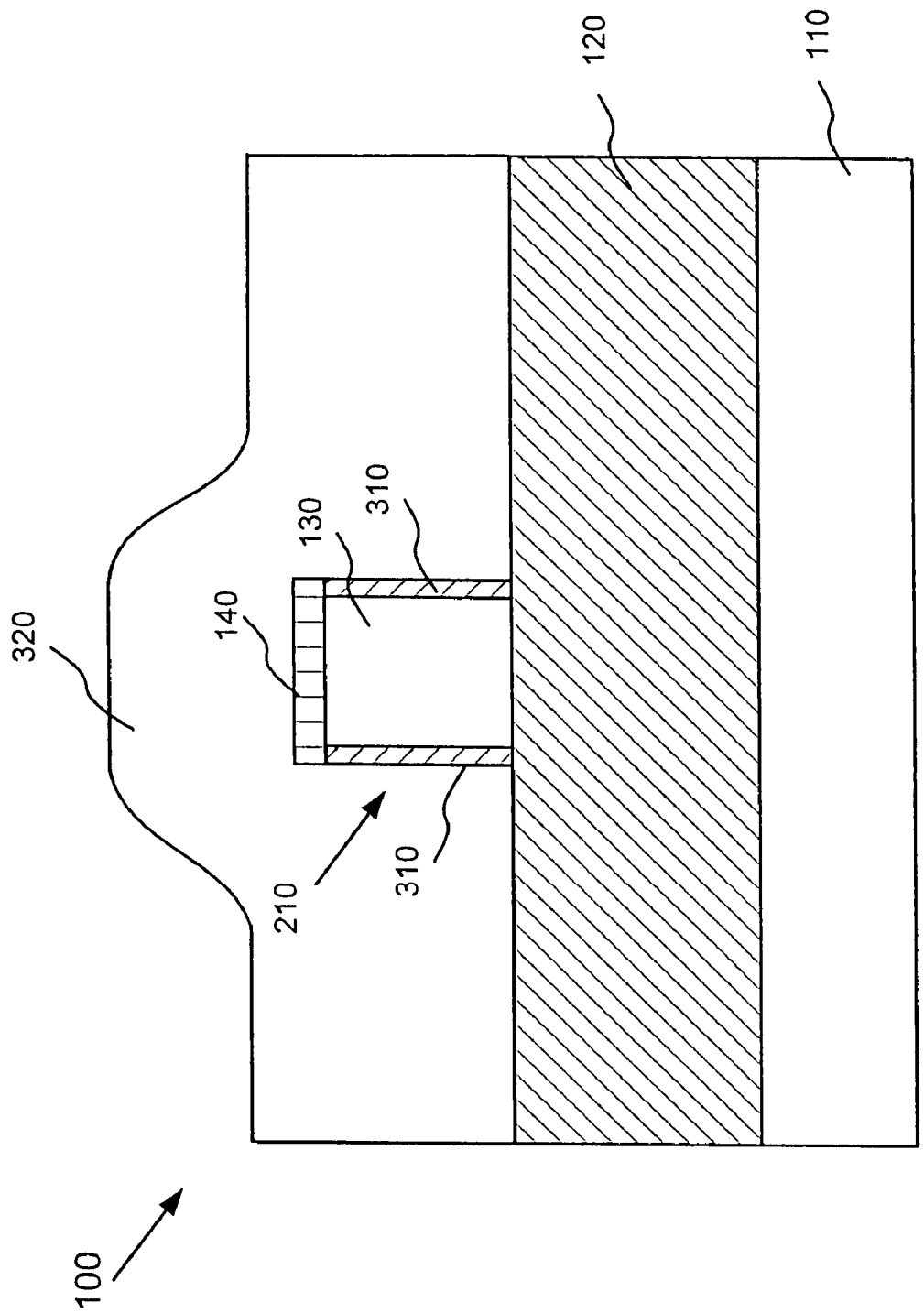
FIG. 3 is a cross-section illustrating the formation of a gate dielectric layer and gate material on the device of FIG. 2B in accordance with an exemplary embodiment of the present invention.

FIG. 3 is a cross-section illustrating the formation of a gate dielectric layer and gate material on fin 210 in accordance with an exemplary embodiment of the present invention. A dielectric layer may be formed on fin 210. For example, a thin sacrificial oxide film 310 may be thermally grown on fin 210, as illustrated in FIG. 3. The oxide film 310 may be grown to a thickness of about 50 Å to about 100 Å and may be formed on the exposed side surfaces of silicon 130 in fin 210 to act as a protective layer during the dummy poly gate removal later in the process. Similar to the oxide film 310, the sacrificial oxide cap 140 may provide insulation for the top surface of fin 210.

A gate material layer 320 may be deposited over semiconductor device 100 after formation of the oxide film 310. In an exemplary implementation, the gate material layer 320 may include polysilicon deposited using conventional chemical vapor deposition (CVD) or other well known techniques. Alternatively, other semiconducting materials, such as germanium or combinations of silicon and germanium, or various metals may be used as the gate material.

Figure 4:
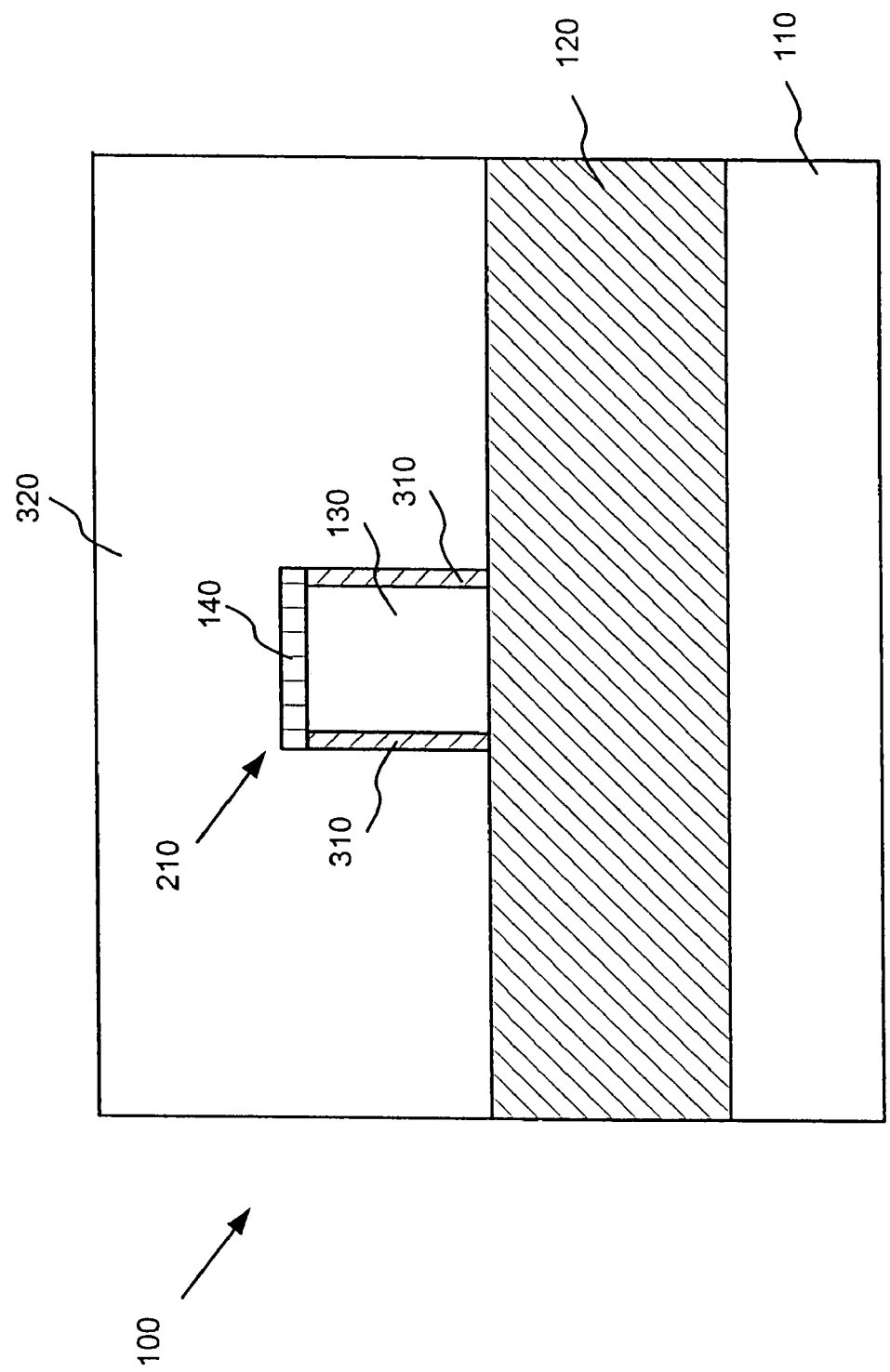
FIG. 4 is a cross-section illustrating the planarizing of the gate material of FIG. 3 in accordance with an exemplary embodiment of the present invention.

FIG. 4 is a cross-section illustrating the planarizing of the gate material 320 in accordance with an exemplary embodiment of the present invention. Planarizing the gate material 320 may remove any non-planar protrusions in the material, such as that shown above the fin 210 in FIG. 3. Returning to FIG. 4, chemical-mechanical polishing (CMP) or other conventional technique may be performed so that the upper surface of gate material 320 is substantially planar. As shown in FIG. 4, the planar gate material 320 may extend above the sacrificial oxide cap 140. A thickness of the gate material 320 after planarizing may range from about 700 Å to about 2000 Å.

FIG. 5A schematically illustrates the top view of semiconductor device 100 at one stage in processing in accordance with an exemplary embodiment of the present invention. As illustrated, a gate structure 510 may be patterned to extend across a channel region of the fin 210. Gate structure 510 may include a gate portion proximate to the sides of the fin 210 and a larger electrode portion spaced apart from the fin 210. The electrode portion of gate structure 510 may provide an accessible electrical contact for biasing or otherwise controlling the gate portion.

FIG. 5B is a cross-section illustrating the formation of the semiconductor device 100 of FIG. 5A in accordance with an exemplary embodiment of the present invention. Gate structure 510 may be defined in the gate material layer 320 by lithography (e.g., photolithography). A bottom antireflective coating (BARC) layer 520 may be deposited on the planar gate material layer 320. As will be understood by those skilled in the semiconductor art, photoresist may be deposited on the BARC layer 520 and patterned in the shape of gate structure 510.

Gate material layer 320 then may be selectively etched to form the gate structure 510 out of the gate material layer 320 on device 100. The planar gate material layer 320 may provide at least a planar bottom surface for BARC layer 520, and may tend to flatten the top surface of BARC layer 520. BARC layer 520 may have a thickness ranging from about 100 Å to about 500 Å. Because of the planar gate material layer 320, the photoresist over the BARC layer 520 may be patterned more precisely, and the gate structure 510's critical dimension (CD) (i.e., its smallest feature size) may be improved.

The source/drain regions 220 and 230 may then be doped. For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such acts are not disclosed herein in order not to unduly obscure the thrust of the present invention. In addition, sidewall spacers (not shown) may optionally be formed prior to the source/drain ion implantation to control the location of the source/drain junctions based on the particular circuit requirements. Activation annealing may then be performed to activate the source/drain regions 220 and 230.

Figures 6A, 6B:
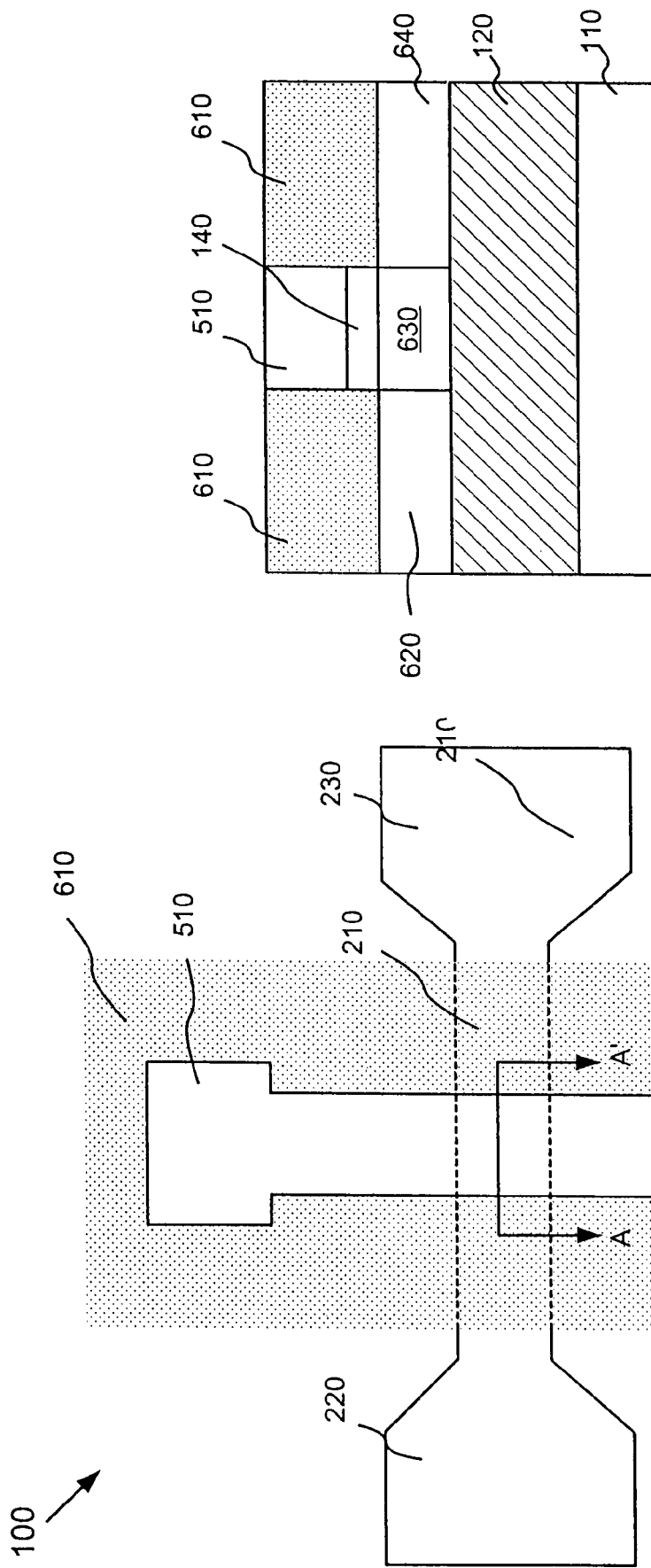
FIG. 6A schematically illustrates another top view of a FinFET structure in accordance with an exemplary embodiment of the present invention.
FIG. 6B is a cross-section illustrating another stage in the formation of the FinFET structure of FIG. 6A in accordance with an exemplary embodiment of the present invention.

FIG. 6A schematically illustrates another top view of semiconductor device 100 in accordance with an exemplary embodiment of the present invention. As illustrated, a sacrificial oxide layer 610 may be deposited around gate structure 510. Although not illustrated in FIG. 6A, sacrificial oxide layer 610 may extend over source/drain regions 220 and 230.

FIG. 6B is a cross-section along line A-A' in FIG. 6A illustrating the formation of the semiconductor device 100 in accordance with an exemplary embodiment of the present invention. As shown, sacrificial oxide layer 610 may be polished back (e.g., by CMP) to be coplanar with the top of gate structure 510. For explanatory purposes, FIG. 6B also illustrates a source portion 620, a channel portion 630, and a drain portion 640 of fin 210. In particular, the source portion 620, channel portion 630, and drain portion 640 may be portions of silicon layer 130.

Figure 7:
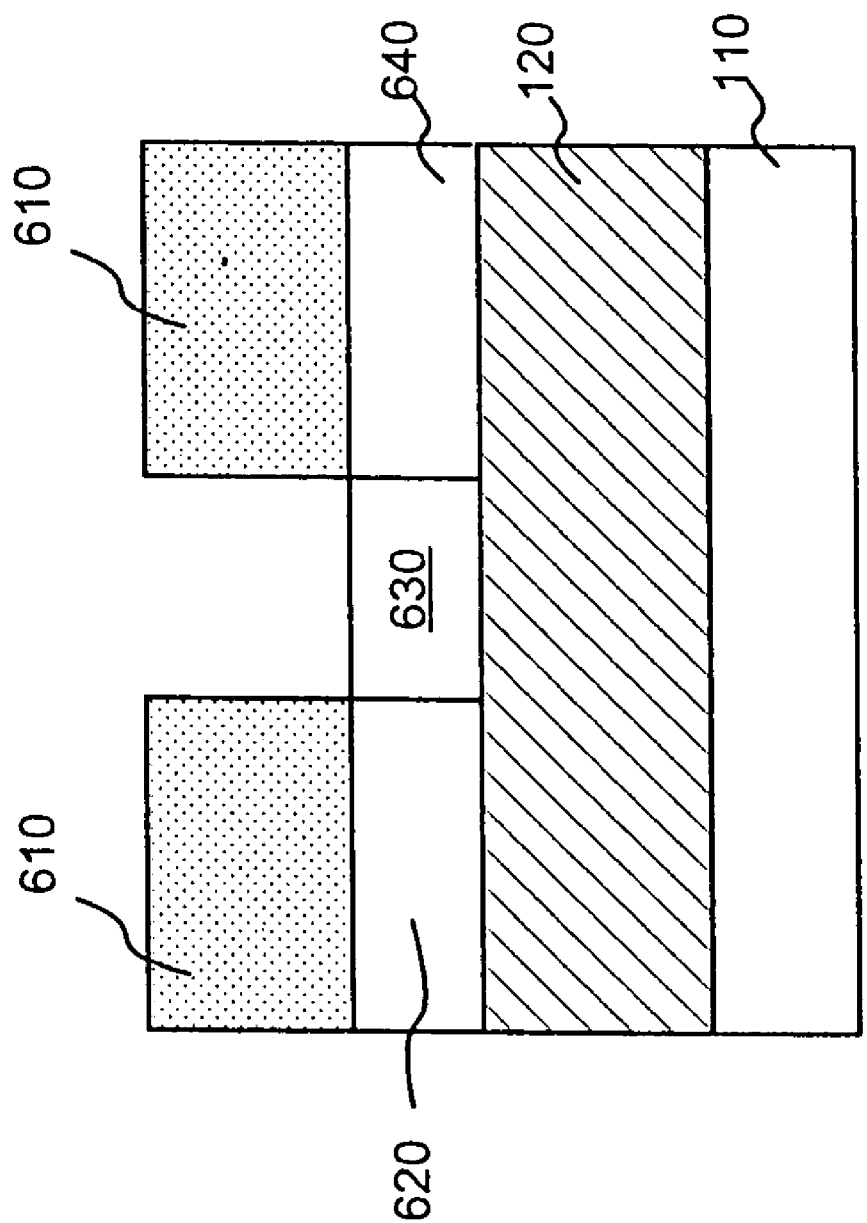
FIG. 7 is a cross-section illustrating a further stage in the formation of the FinFET structure of FIG. 6A in accordance with an exemplary embodiment of the present invention.

FIG. 7 is a cross-section along line A-A' in FIG. 6A illustrating a further stage in the formation of the semiconductor device 100 in accordance with an exemplary embodiment of the present invention. As shown, gate structure 510 (e.g., polysilicon) may be removed, for example by etching. Sacrificial oxide cap 140 under the gate structure 510 may protect the channel portion 630 of fin 210 from being etched out during the removal of gate structure 510. Then, the oxide film 310 if present may be removed (e.g., by etching) so that the channel portion 630 of fin 210 (e.g., silicon 130) is exposed.

FIG. 8A schematically illustrates the top view of semiconductor device 100 in accordance with an exemplary embodiment of the present invention. FIG. 8B is a cross-section along line A-A' in FIG. 8A illustrating a final stage in the formation of the semiconductor device 100 in accordance with the principles of the present invention. A high-k dielectric material 810 such as $HfO_2$ or HfSiO may be deposited on the channel portion 630 of fin 210. Such a high-k dielectric material 810 may have a dielectric constant k higher than about 3.9. In another implementation consistent with the principles of the invention, dielectric material 810 may be an oxide that is thermally grown from the silicon 130 in the channel portion 630 of fin 210. The dielectric constant k of such $SiO_2$ material may be about 3.9. In any event, the dielectric material 810 may serve as the gate dielectric layer for semiconductor device 100.

Next, a metal, such as TaN or TiN may be deposited into the gate-shaped space (which may be referred to as a "gate recess") within sacrificial oxide layer 610 left by the removal of gate structure 510 (see FIGS. 6A and 7). This metal may form gate 820, and may be polished (e.g., by CMP) to obtain a roughly planar top surface as shown in FIG. 8B. Finally, the sacrificial oxide layer 610 around gate 820 may be removed to complete semiconductor device 100 shown in FIG. 8A.

Thus, in accordance with the present invention, a FinFET device 100 may be formed with a high-k gate dielectric 810 and a metal gate 820 using a damascene process. Advantageously, the resulting structure exhibits good short channel behavior. In addition, the present invention provides increased flexibility and can be easily integrated into conventional processing.

OTHER IMPLEMENTATIONS

In some implementations, it may be desirable to reduce the parasitic resistance in a FinFET by thickening the source and drain regions with selective epitaxial growth. FIG. 9A is a cross-section illustrating a typical FinFET 900. Silicon material on an insulator 920 that is on a substrate 910 may be formed into a source region 980, a fin 930, and drain region 990. FIG. 9A shows a cross section of the fin structure 930. A cap oxide layer 940 may be formed over the fin 930. Gate oxide layers 950 may be grown on the sides of the fin 930, and then a polysilicon layer 960 may be deposited over the fin 930.

As illustrated in FIG. 9B, gate 970 may be defined and etched from polysilicon layer 960. Cap oxide layer 940 may be thick enough so that it is not completely etched out during formation of the gate 970. Source and drain regions 980/990 (including non-channel portions of fin 930) may be selectively thickened by epitaxial growth. In this manner, parasitic resistance may be significantly reduced in the FinFET 900.

Figure 10:
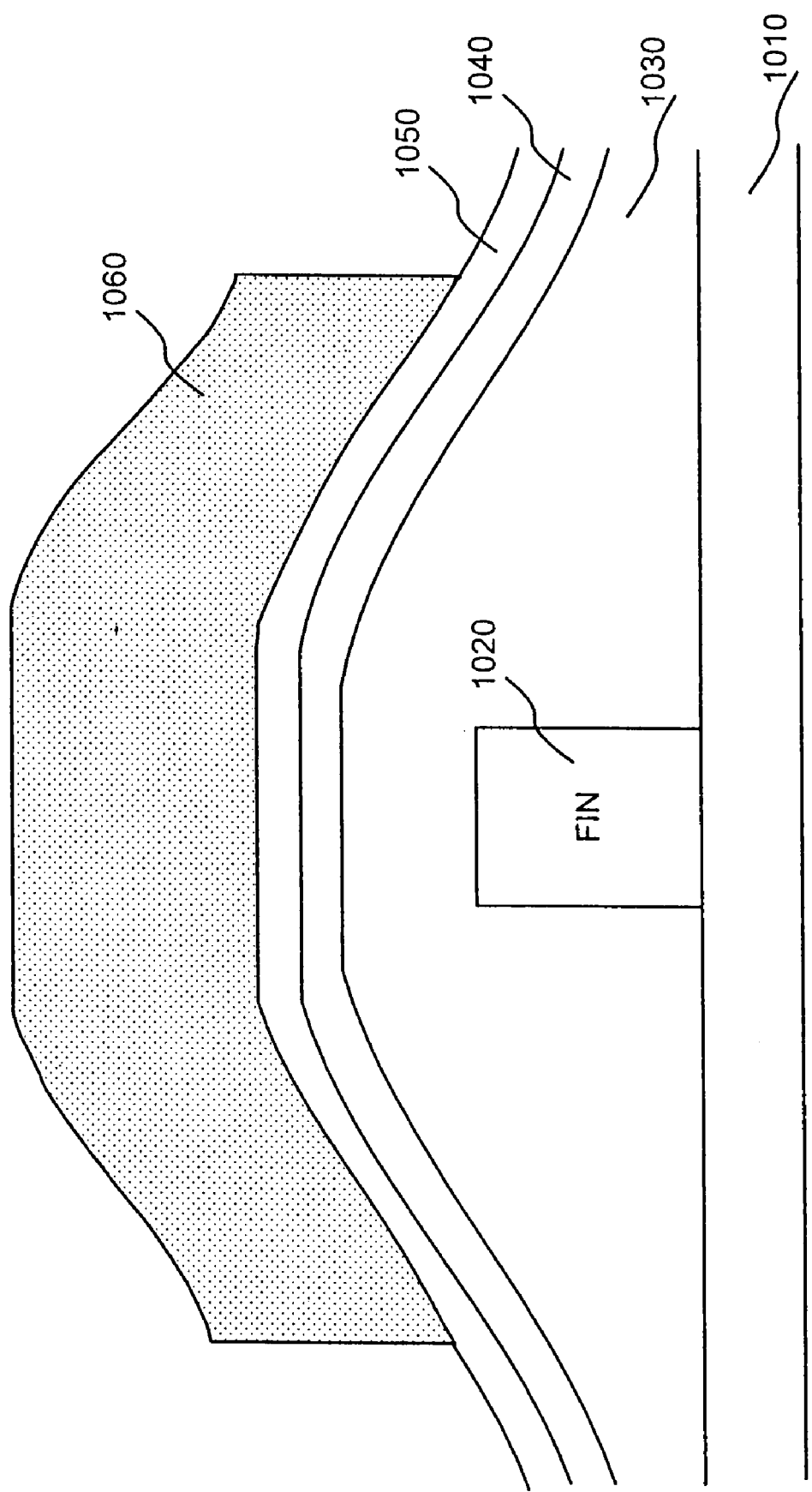
FIG. 10 is a cross-sectional view illustrating formation of a gate with a small width in accordance with another implementation of the present invention.

In other implementations, a FinFET with a small line width gate without stringers may be desired. Also, it may be desirable to protect the source/drain fin during formation of such a gate. FIG. 10 is a cross-sectional view illustrating formation of a gate with a small width in accordance with another implementation of the present invention. A silicon fin 1020 may be formed on an insulator 1010, such as a buried oxide. Polysilicon layer 1030 may be formed over the fin 1020, and an amorphous carbon (a-c) layer 1040 may be formed over the polysilicon layer 1030.

An antireflective coating (ARC) 1050 (e.g., silicon oxynitride SiON or silicon rich oxide SiRO) may be formed over a-c layer 1040, and a photoresist layer 1060 for the gate may be formed over ARC 1050. The photoresist 1060 may be trimmed to achieve a small gate critical dimension (CD). Next ARC 1050 may be opened around the trimmed photoresist 1060.

The a-c layer 1040 may be etched, and in the process the remaining photoresist 1060 may be completely removed. Etching of the polysilicon layer 1030 may involve three stages: breakthrough (BT), poly main etch (ME), and poly over etch (OE). During the BT etch, any remaining ARC material 1050 may be consumed. The etched (defined) a-c layer 1040 may be a hard mask for the remaining poly etch stages. A relatively large amount of OE may be used to ensure that the gate structure formed from the polysilicon layer 1030 is free of stringers. In this manner, the source/drain junction may protected, while achieving a stringer-free gate with a small CD.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A semiconductor device, comprising:
   a substrate;
   an insulating layer formed on the substrate;
   a conductive fin formed on the insulating layer, the conductive fin including a plurality of side surfaces and a top surface;
   a source region formed on the insulating layer adjacent a first end of the conductive fin;
   a drain region formed on the insulating layer adjacent a second end of the conductive fin;
   a dielectric layer comprising hafnium formed on the top surface and side surfaces of the conductive fin in the channel region of the semiconductor device; and
   a metal gate formed on the insulating layer adjacent the conductive fin in a channel region of the semiconductor device, the metal gate having a thickness ranging from about 700 Å to about 2,000 Å.

2. The semiconductor device of claim 1, wherein the dielectric layer has a dielectric constant greater than about 3.9.

3. The semiconductor device of claim 1, wherein the metal gate comprises at least one of titanium or tantalum.

4. A semiconductor device, comprising:
   a substrate;
   an insulating layer formed on the substrate;
   a silicon fin formed on the insulating layer, the silicon fin including a plurality of side surfaces and a top surface;
   a dielectric layer comprising hafnium formed on the top surface and side surfaces of the silicon fin in the channel region of the semiconductor device;
   a source region formed on the insulating layer adjacent a first end of the silicon fin;
   a drain region formed on the insulating layer adjacent a second end of the silicon fin; and
   a metal gate formed on the insulating layer adjacent the silicon fin in a channel region of the semiconductor device, the metal gate having a thickness ranging from about 700 Å to about 2,000 Å.

5. The semiconductor device of claim 4, wherein the silicon fin has a thickness ranging from about 300 Å to about 1,500 Å.

6. The semiconductor device of claim 4, wherein the dielectric material comprises a hafnium oxide.

7. The semiconductor device of claim 4, wherein the dielectric layer comprises HfSiO.

8. The semiconductor device of claim 4, wherein the metal gate comprises titanium.

9. The semiconductor device of claim 8, wherein the metal gate comprises a titanium nitride.

10. The semiconductor device of claim 4, wherein the metal gate comprises tantalum.

11. The semiconductor device of claim 10, wherein the metal gate comprises a tantalum nitride.

12. A semiconductor device, comprising:
    a substrate;
    an insulating layer formed on the substrate;
    a conductive fin formed on the insulating layer, the conductive fin including a plurality of side surfaces and a top surface and having a thickness ranging from about 300 Å to about 1,500 Å;
    a dielectric layer comprising hafnium formed on the top surface and side surfaces of the silicon fin;
    a source region formed on the insulating layer adjacent a first end of the silicon fin;
    a drain region formed on the insulating layer adjacent a second end of the silicon fin; and
    a metal gate comprising titanium or tantalum formed on the insulating layer and over a portion of the conductive fin, the metal gate having a thickness ranging from about 700 Å to about 2000 Å.

13. The semiconductor device of claim 12, wherein the insulating layer comprises a silicon oxide having a thickness ranging from about 1,000 Å to about 3,000 Å.

14. The semiconductor device of claim 12, wherein the dielectric layer has a dielectric constant greater than 3.9.

15. The semiconductor device of claim 12, wherein the metal gate comprises a titanium nitride.

16. The semiconductor device of claim 12, wherein the metal gate comprises a tantalum nitride.

* * * * *